(12) United States Patent
Koide et al.

(10) Patent No.: US 6,313,995 B1
(45) Date of Patent: Nov. 6, 2001

(54) COOLING SYSTEM OF A PRINTED BOARD

(75) Inventors: Hiromichi Koide; Shinya Suzuki; Ichiro Tano, all of Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/592,042

(22) Filed: Jun. 12, 2000

(30) Foreign Application Priority Data

Aug. 18, 1999 (JP) .................................................. 11-231779

(51) Int. Cl.⁷ ........................................................ H05K 7/20
(52) U.S. Cl. ........................... 361/705; 361/704; 361/715; 361/719; 361/737; 165/80.2; 165/80.3; 174/16.3
(58) Field of Search .................................... 361/702–710, 361/717–719, 690–699, 688, 711, 720–721, 737, 752, 831; 165/80.2, 80.3, 80.4, 185; 257/706–727, 686, 688, 792, 796; 174/16.3

(56) References Cited

U.S. PATENT DOCUMENTS

| | | | |
|---|---|---|---|
| 3,946,276 | * 3/1976 | Braun et al. | 317/100 |
| 4,093,971 | * 6/1978 | Chu et al. | 361/382 |
| 4,621,304 | * 11/1986 | Oogaki et al. | 361/386 |
| 4,897,764 | * 1/1990 | Bruchmann et al. | 361/387 |
| 4,942,497 | * 7/1990 | Mine et al. | 361/385 |
| 5,175,613 | * 12/1992 | Barker et al. | 257/713 |
| 5,862,038 | * 1/1999 | Suzuki et al. | 361/704 |
| 5,999,407 | * 12/1999 | Meschter et al. | 361/704 |

\* cited by examiner

*Primary Examiner*—Leo P. Picard
*Assistant Examiner*—Michael Datskovsky
(74) *Attorney, Agent, or Firm*—Flynn, Thiel, Boutell & Tanis, P.C.

(57) ABSTRACT

A cooling system can cool electronic devices with assurance following the heights of the electronic devices mounted on a printed board. The cooling system is thin and light in weight and can easily inspect and maintain the electronic devices. A cooling pipe is disposed in a U-shape about a plurality of electronic devices mounted on the printed board. The cooling pipe is jointed with the cooling plate by caulking from the opposite side of the printed board. A thermal conduction plate is engaged with the cooling plate from the upper portion thereof and the thermal conduction members each having the notched portion are inserted into the insertion holes of the thermal conduction plate. The thermal conduction members can be slid up and down and turned to the right and left in the insertion holes and they are pressed and biased against the electronic devices by a leaf spring provided on the thermal conduction plate. Each electronic device can be inspected by inserting a probe or the like through the notched portion.

16 Claims, 5 Drawing Sheets

COOLING SYSTEM OF A PRINTED BOARD

BACKGROUND OF THE INVENTION

1. Field of the Invention:

The invention relates to a cooling system of a printed board on which a plurality of electronic devices are mounted.

2. Related Art:

As an integrated circuit (hereinafter referred to as IC) which is mounted on a printed board is becoming denser, a heating value of the IC, namely, the amount of heat generated in the IC increases. Accordingly, it is necessary to forcibly cool the IC.

An example of a conventional cooling system of a printed board is described with reference to FIG. 5 and FIG. 6.

FIG. 5 is an exploded perspective view of a conventional cooling system of a printed board. In FIG. 5, the cooling system of a printed board comprises an electronic device 31, a cylindrical thermal conduction body 32, a spacer 33, a coil spring 34, a cooling block 35, cooling pipes 36, and screws 37.

A thermal conductivity compound 39a is applied onto the upper surface of a package portion 31a of the electronic device 31, and a thermal conductivity compound 39b is applied onto an insertion hole 35a provided in the cooling block 35 through which the thermal conduction body 32 is inserted at the portion where it contacts the thermal conduction body 32. The cooling block 35 is fixed to a printed board 38 by way of the spacer 33.

Screw holes 35b are provided on the upper surface of the cooling block 35. Both ends of the coil spring 34 are attached to the cooling block 35 by two screws 37. Owing to a tensile strength of the coil spring 34, the bottom surface of the cylindrical thermal conduction body 32 is pressed against the upper portion of the package portion 31a of the electronic device 31 by way of the thermal conductivity compound 39a.

FIG. 6 is a view for showing a state of mounting the conventional cooing system. In FIG. 6, the printed board 38 comprises a connector 41, guard rails 42, a fixed block 43, closing type couplers 44 and a pulling plate 45. The cooling pipes 36 through which a refrigerant 40 flows are fixed to the fixed block 43 which is fixed to the pulling plate 45 provided on the edge of the printed board 38. When the refrigerant 40 is forced to flow through the cooling pipes 36, the cooling block 35 around the cooling pipes 36 is cooled so that the electronic device 31 and printed board 38 are cooled by way of the cylindrical thermal conduction body 32.

Since a plurality of electronic devices 31 are varied in height, a thermal conductivity gel or a contactor such as a spring or the like is needed for absorbing the variation in height between the bottom surface of the cylindrical thermal conduction body 32 and the upper surface of the package portion 31a of the electronic device 31. However, as the heating density of the electronic device 31 increases, the thermal resistance of the thermal conductivity gel or the contactor such as a spring increases so that the reduction of variation in temperature generated in the electronic device 31 becomes difficult,.

Further, if failed electronic devices are produced on the printed board 38 on which the electronic devices are mounted, such failed electronic devices need to be inspected or replaced individually with other ones. Since the cooling part (cooling block shaft 35) covers the upper surface of the electronic device 31, when the electronic devices are inspected or replaced with other ones, the inspection has been difficult or an entire cooling part needed to be detached or removed for the replacement of the electronic devices. Accordingly, it take many steps for inspection, replacement or re-assembly.

Further, the conventional cooling system was high in packaged height and needed a heavy cooling block 35.

SUMMARY OF THE INVENTION

It is an object of the invention to provide a cooling system capable of securely cooling the electronic devices mounted on the printed board following or in accordance with heights of the electronic devices. Another object of the invention is to provide a cooling system that is thin and light in weight and facilitates the inspection and maintenance of the electronic devices mounted on the printed board.

To achieve the above object, a cooling system of a printed board according to a first aspect of the invention comprises a cooling member having a cooling path (e.g., a cooling pipe 1) which is thermally connected onto a printed board 6 on which an electronic device (e.g. an electronic device 7) is mounted as shown in FIG. 1, a thermal conduction member being thermally connected onto the electronic device, wherein the thermal conduction member 4 is inserted into an insertion hole formed in the cooling member so as to be thermally connected to the cooling member, thereby cooling the printed board and electronic device, characterized in that a plurality of thermal conduction members are provided in correspondence with a plurality of electronic devices.

A sectional area of each thermal conduction member is set to be greater than that of each electronic device. Further, each thermal conduction member can slide up and down in the insertion hole formed in the cooling member.

As mentioned above, according to the first aspect of the invention, since there are provided thermal conduction members in correspondence with respective electronic devices as the thermal conduction members to be inserted into the insertion holes of the cooling member on the printed board, the thermal conduction members can be disposed at the positions matching the heights of respective electronic devices, thereby dispensing with the interposition of contactors between the electronic devices and thermal conduction members so that respective electronic devices can be uniformly cooled.

A cooling system of a printed board according to a second aspect of the invention is characterized in further comprising, in the cooling system of the first aspect of the invention, a spring member (e.g. a leaf spring 5) provided on the cooling member for pressing and biasing the thermal conduction members against the electronic devices, and a thermal conductivity elastic member by way of which the cooling members are fixed onto the printed board.

Here, a force to be pressed by the spring member is set to be a low load of not more than 1 Kg. For each thermal conductivity elastic member, gel excellent in thermal conductivity or a spring is used.

As mentioned above, according to the second aspect of the invention, each thermal conduction member can be pressed against and biased against each electronic device by the spring member so that the thermal conduction members can be forced to follow the heights of the electronic devices, and hence the thermal conduction members can be always thermally connected to the electronic devices. Further, since the pressing force of the spring member is set to be a low load, a stress applied to each electronic device can be set to the minimum.

Still further, since the cooling member is fixed onto the printed board by way of the thermal conductivity elastic member, the cooling member and printed board can be always thermally connected to each other.

A cooling system of a printed board according to a third aspect of the invention is characterized in that the cooling member of the first aspect of the invention comprises, for example, a frame-shaped cooling plate 2 fixed to the printed board and having a cooling path, and a thermal conduction plate 3 fixed to the cooling plate 2 and having insertion holes 9 as shown in FIG. 1.

As mentioned above, according to the third aspect of the invention, since the cooling member is composed of the cooling plate and thermal conduction plate, the cooling system of a printed board can be rendered thin and light in weight. Further, since the cooling plate is frame-shaped, each electronic device can be replaced with another one by merely detaching the thermal conduction plate from the printed board.

A cooling system of a printed board according to a fourth aspect of the invention is characterized in that, in the cooling system of the third aspect of the invention, for example, a cooling pipe 1 forming the cooling path is connected to the cooling plate, and each thermal conduction member is interposed between the cooling plate and the printed board as shown in FIG. 2.

A cooling system of a printed board according to a fifth aspect of the invention is characterized in that, in the cooling system of the first aspect of the invention, each thermal conduction member is cylindrical and has an electric insulation layer on its surface coated with fluorine resin or covered with a polyimide tape.

A cooling system of a printed board according to a sixth aspect of the invention is characterized in that, in the cooling system of the first aspect of the invention, for example, a thermal conductivity compound 11 is filled between respective thermal conduction members, electronic devices and cooling members as shown in FIG. 2.

As mentioned above, according to the sixth embodiment of the invention, since the thermal conductivity compound can be filled between respective thermal conduction members, electronic devices and cooling members, each thermal conduction member can be slid up and down while securing thermal conductivity, and hence thermal resistance can be kept stable at a low value.

A cooling system of a printed board according to a seventh aspect of the invention is characterized in that, in the cooling system of the fifth aspect of the invention, for example, each thermal conduction member has a notched portion 10 formed by cutting a part of the cylinder as shown in FIG. 3.

As mentioned above, according to the seventh aspect of the invention, since each thermal conduction member is cylindrical and has a notched portion at a part thereof, the position of the notched portion can be changed by turning each thermal conduction member and each electronic device can be directly seen through the notched portion. Further, each electronic device can be inspected by inserting a probe through this notched portion. Accordingly, each electronic device can be inspected while it is actually operated in a state where each electronic device is mounted on the cooling system of a printed board.

PREFERRED EMBODIMENT OF THE INVENTION

Figure 1:
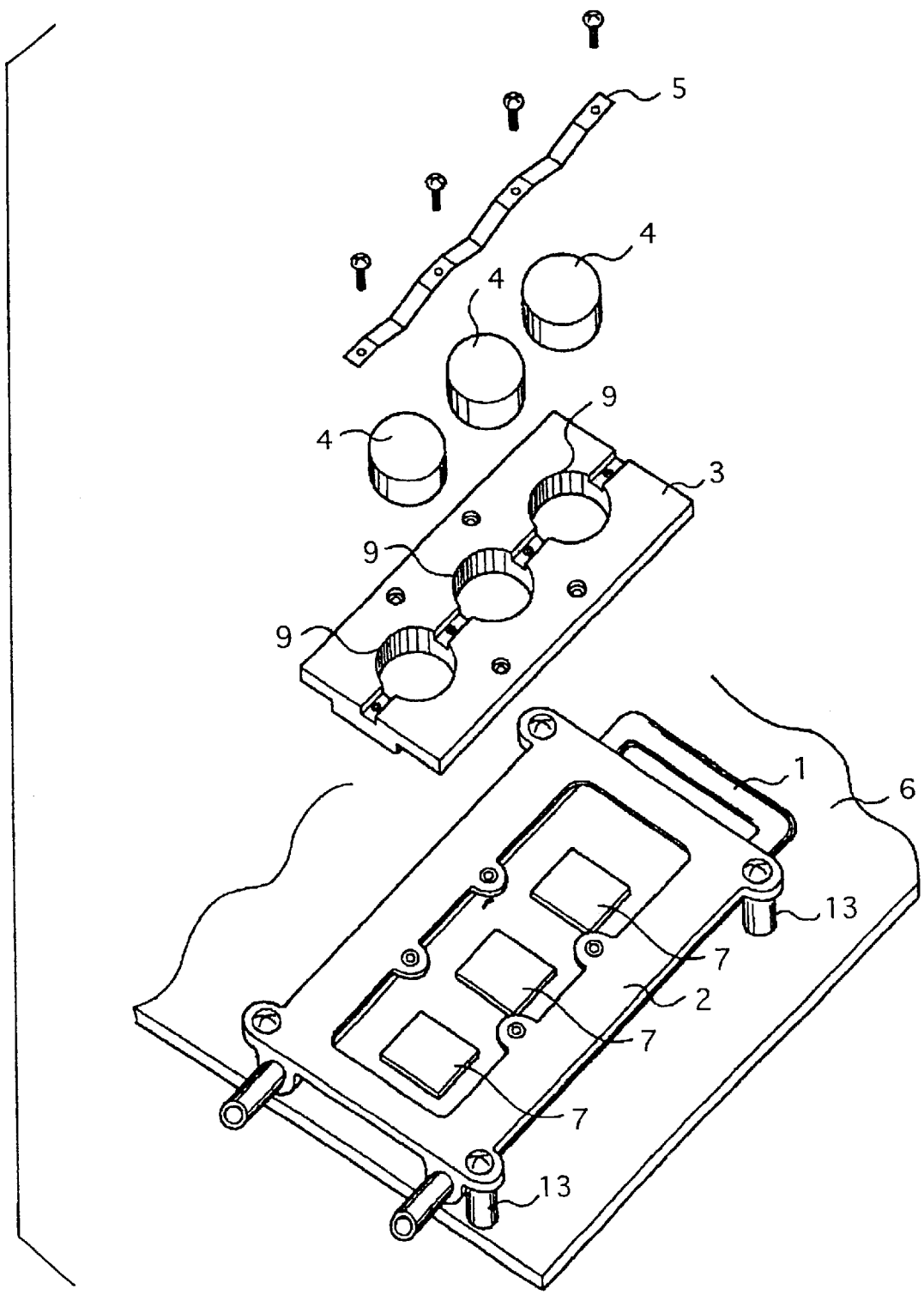
FIG. 1 is an exploded perspective view of a cooling system of a printed board according to a preferred embodiment of the invention.
Figure 2:
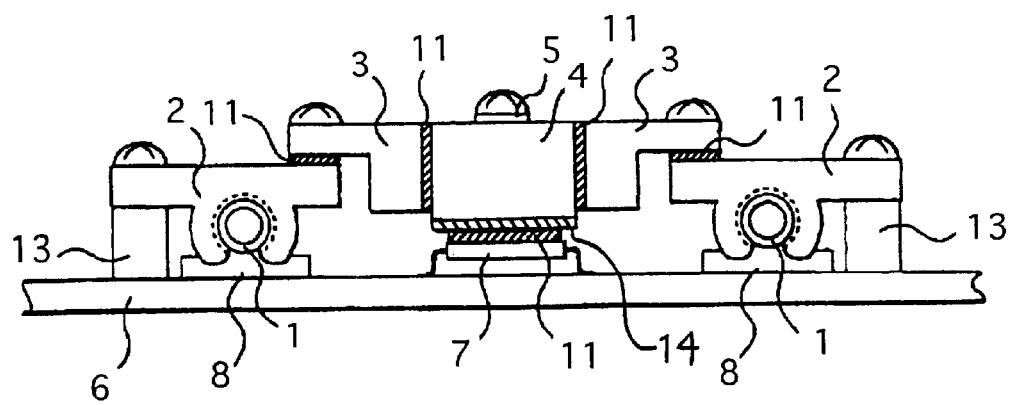
FIG. 2 is a sectional view of the cooling system of a printed board in FIG. 1 when it is assembled.
Figure 3:
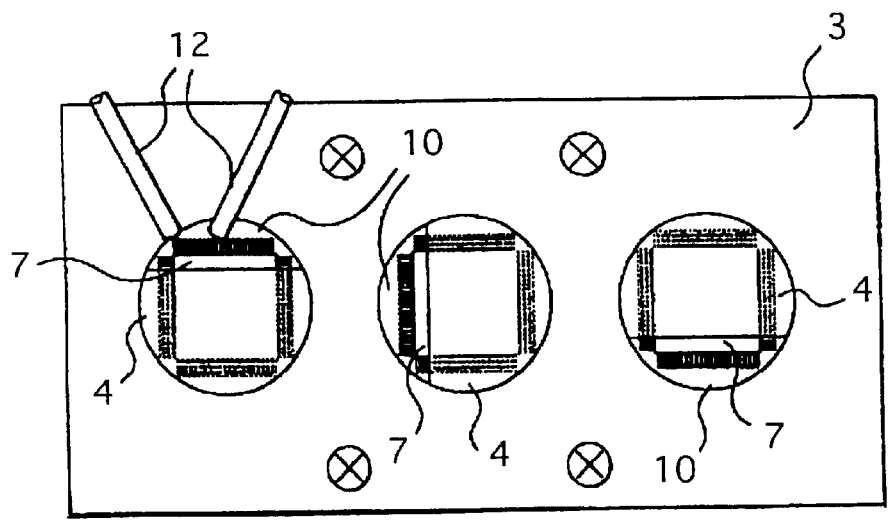
FIG. 3 is a schematic plan view of a thermal conduction plate in a state showing the relation between the electronic devices and thermal conduction members when inspecting the electronic devices.

A cooling system of a printed board according to a preferred embodiment of the invention is now described with reference to FIG. 1 to FIG. 4. The cooling system of a printed board is generally composed of a cooling pipe 1, a cooling plate 2, a thermal conduction plate 3, thermal conduction members 4 and a leaf spring 5.

The cooling pipe 1 is disposed in a U-shape around a plurality of electronic devices 7 respectively mounted on a printed board 6, and a thermal conductivity gel 8 is sandwiched or interposed between the cooling pipe 1 and printed board 6.

The cooling pipe 1 is jointed with the cooling plate 2 by caulking and it is sandwiched by the cooling plate 2 and printed board 6.

The cooling plate 2 is formed onto the printed board 6 by four struts 13 and the thermal conductivity gel 8 is sandwiched between the cooling plate 2 and printed board 6 at the portion where they are brought into contact with each other.

The cooling plate 2 has a frame-like shape and the thermal conduction plate 3 is fixed to the cooling plate 2 in the manner that thermal conduction plate 3 is engaged with the cooling plate 2 from the upper portion thereof. A thermal conductivity compound 11 is filled between the cooling plate 2 and thermal conduction plate 3 at the portion where they are jointed with each other.

The thermal conduction plate 3 has circular insertion holes 9 that are formed by penetrating it at positions immediately over the electronic devices 7 mounted on the printed board 6. The cylindrical thermal conduction members 4 each having a notched portion 10 at its part are inserted into the insertion holes 9 (see FIG. 3). The cross section of each thermal conduction member 4 is set to be greater than that of each electronic device 7.

The thermal conductivity compound 11 is filled in a gap between the insertion holes 9 and thermal conduction members 4. The thermal conduction members 4 can be slid up and down and tuned to the right and left in the insertion holes 9. Suppose that the gap between each insertion hole 9 and thermal conduction member 4 is, for example, about 50 $\mu$m, stable low thermal resistance can be realized.

The leaf spring 5 is provided on the thermal conduction plate 3 in the vicinity of the insertion holes 9 so as to press and bias the thermal conduction members 4 against the electronic devices 7 by the pressing force of the leaf spring An electric insulation layer 14 is applied to and formed on each thermal conduction member 4 by fluorine resin coating or polyimide tape or the like at its surface while the thermal conductivity compound 11 is applied onto each thermal conduction member 4 at the sides of the electronic devices 7. A thermal resistance by the insulation layer can be substantially neglected, and an insulation capacity assures 1000 M Ω with a direct current of 500 V.

A method of cooling the printed board 6 using the cooling system of a printed board is described next.

Figure 4:
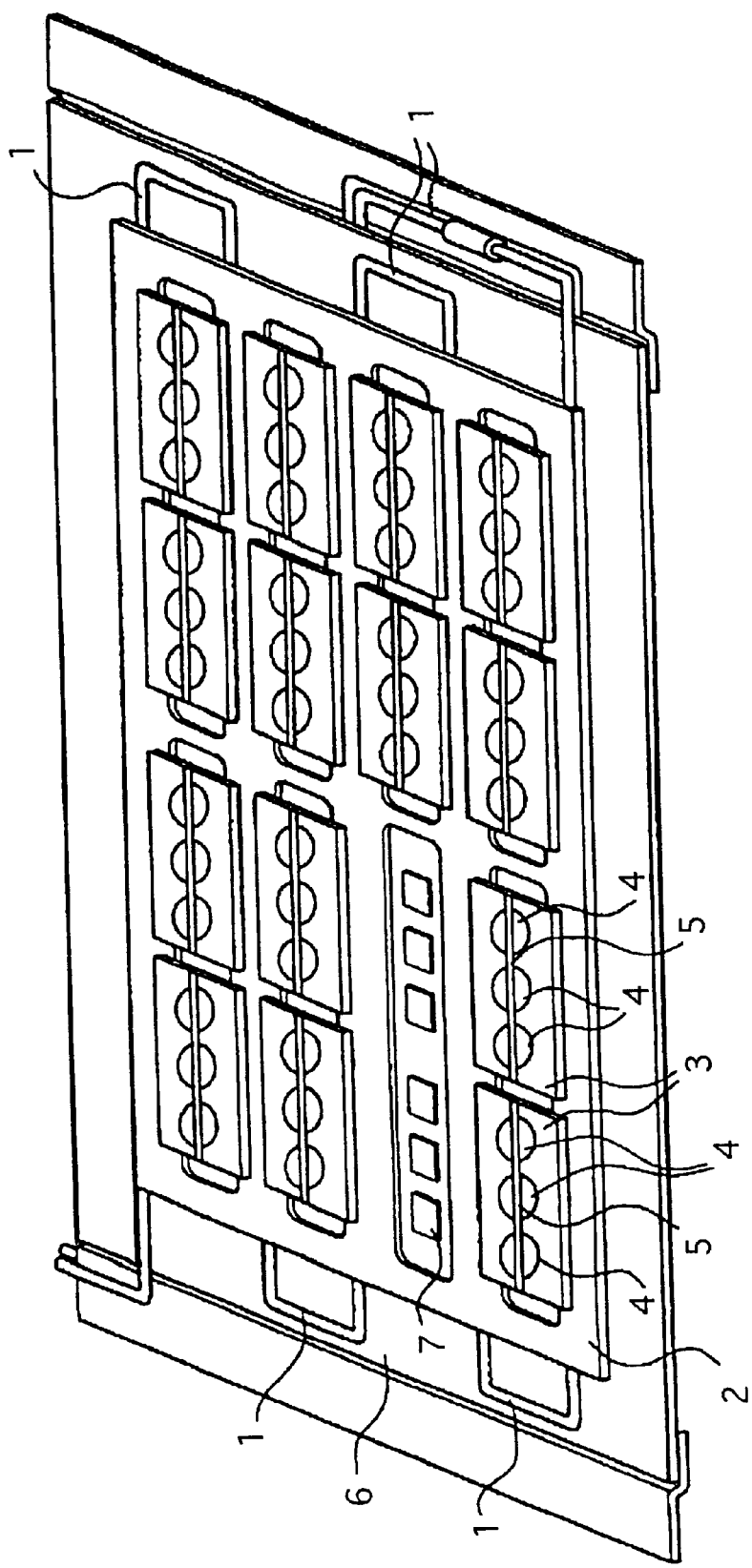
FIG. 4 is a perspective view of the cooling system of a printed board in FIG. 1 when it is installed on the printed board.
Figure 5:
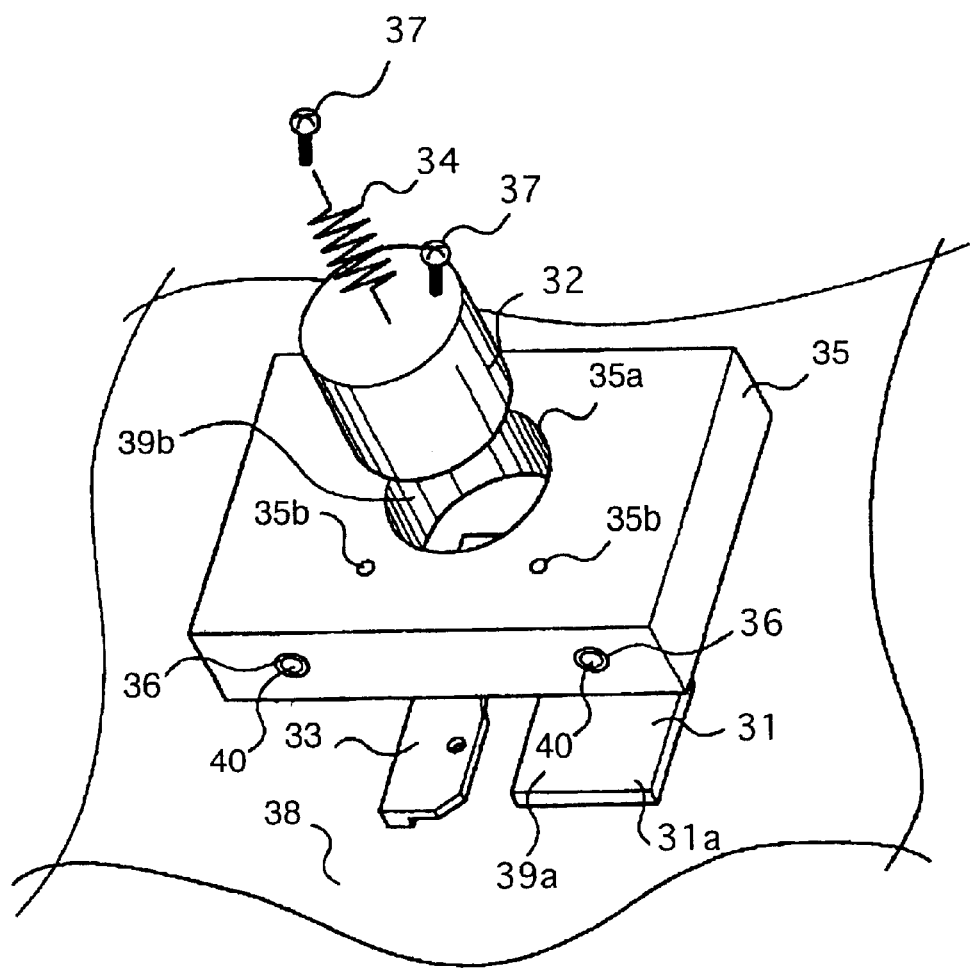
FIG. 5 is an exploded perspective view of a conventional cooling system of a printed board.
Figure 6:
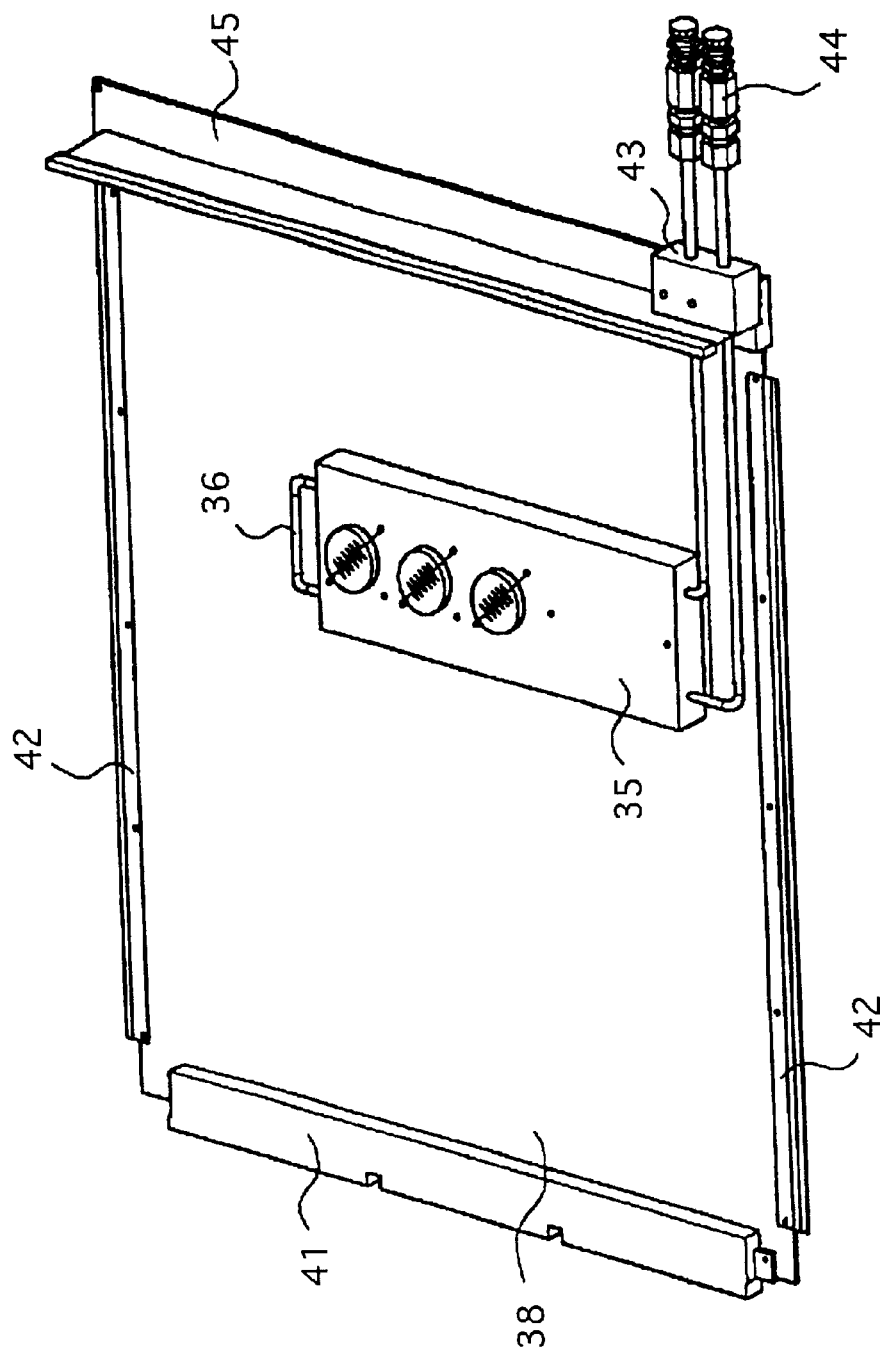
FIG. 6 is a perspective view of the conventional cooling system of a printed board in FIG. 5 when it is installed on the printed board.

A plurality of cooling systems of a printed board are installed such that the thermal conduction members 4 correspond one by one to each of the plurality of electronic devices 7 mounted on the printed board 6 (see FIG. 4). The cooling systems of a printed board may be installed on both sides of the printed board 6. At this time, a single cooling pipe 1 is jointed with a plurality of cooling plates 2 by caulking.

When the cooling system of a printed board is installed on the printed board 6, the thermal conduction members 4 are pressed down by the pressing force of the leaf spring 5 to bring into contact with the corresponding electronic devices 7.

When refrigerant is circulated in the cooling pipe 1, heat of the refrigerant is transmitted through the cooling pipe 1 to the printed board 6 and cooling plate 2, and the heat transmitted to the cooling plate 2 cools the printed board 6, and at the same time, it is transmitted to the thermal conduction plate 3. Further, since the heat is transmitted from the thermal conduction plate 3 to each thermal conduction member 4 that is brought into contact with each electronic device 7 by the leaf spring 5, a plurality of electronic devices 7 are cooled.

When inspecting the electronic devices 7, the thermal conduction members 4 corresponding to the electronic devices 7 to be inspected are turned as shown in FIG. 4, and the notched portions 10 of the respective thermal conduction members 4 are moved to the positions where the electronic devices 7 are inspected. A probe 12 or the like is inserted through each notched portion 10 to inspect each electronic device 7.

When substituting a part of the electronic devices 7 for another device, the thermal conduction plate 3 is detached from the cooling plate 2 to replace each electronic device 7 with another.

With the configuration of the cooling system of a printed board according to the present embodiment, the thermal conduction members 4 corresponding to the electronic devices 7 are provided and the former is pressed and biased against the latter so that respective thermal conduction members 4 are forced to follow the electronic devices 7 having different heights, thereby dispensing with contactors such as springs or gel so that respective electronic devices 7 can be uniformly cooled. When the cooling system of a printed board of the invention is applied to an electronic device, e.g., having the size of 14 mm ×14 mm and the power consumption of 10 W, the variation in temperature for each electronic device can be set within 5° C.

Since the pressing force of the leaf spring 5 is set to a low value, a stress applied to each electronic device 7 can be set to the minimum value, so that the electric breakage hardly occurs, and the pressing force by the leaf spring 5 can be easily adjusted.

Since both the frame-shaped cooling plate 2 and thermal conduction plate 3 are used, thin and light cooling system of a printed board can be realized compared with a case using a block-shaped cooling member so that the printed board can be mounted three-dimensionally or in high density. Since the height of the cooling system of a printed board can be set to, e.g., about 12 mm, the electronic devices can be mounted on both sides of the printed board, and hence the cooling system can be mounted on the printed board with about 30 mm pitches.

Further, since each thermal conduction member 4 has the notched portion 10, each electronic device 7 can be inspected without detaching the cooling system. When each electronic device 7 is replaced with another one, such replacement can be easily performed by merely detaching the thermal conduction plate 3 because the cooling plate 2 is frame-shaped.

Since the thermal conductivity gel 8 is interposed between the printed board 6, cooling pipe 1 and cooling plate 2, the printed board 6 per se can be always cooled. Further, since the thermal conductivity compound 11 is filled between respective components, a thermal resistance can be maintained steady at low level, improving cooling effect.

Although the cooling system according to the preferred embodiment has three thermal conduction members relative to one cooling plate, the numbers of the thermal conduction member and cooling plate are not limited thereto but they may be arbitrarily set in accordance with a printed board and the electronic devices to be used. Further, although one leaf spring pressed three thermal conduction members, one leaf spring may press one thermal conduction member, i.e., one by one or one leaf spring may press a plurality of thermal conduction members. If the thermal conduction members can be pressed and biased with assurance, the configuration of the leaf spring is arbitrary.

It is needless to say that the detailed concrete configuration can be appropriately changed.

As mentioned in detail above, according to the first aspect of the invention, since the thermal conduction members to be inserted into the insertion holes of the cooling member provided on the printed board are provided for every electronic devices, it is possible to change the installing positions of the corresponding thermal conduction members in accordance with the heights of respective electronic devices. Accordingly, the electronic devices can be directly cooled by the thermal conduction members irrespective of the heights of the electronic devices so that the electronic devices can be uniformly cooled.

According to the cooling system of a printed board of the second aspect of the invention, the thermal conduction members can be forced to follow the heights of the electronic devices by the pressing force of the spring member, it is possible to maintain the thermal connection between the thermal conduction members and electronic devices irrespective of the heights of the electronic devices.

Further, since the thermal conductivity elastic member is provided between the cooling member and the printed board, the printed board can be also always thermally connected to the cooling member, thereby efficiently cooling the printed board.

According to the cooling system of a printed board of the third aspect of the invention, since the cooling member is composed of the frame-shaped cooling plate and thermal conduction plate, it is possible to achieve the light weight of the cooling system of a printed board and to reduce the thickness of the cooling system of a printed board. Further, the electronic devices can be replaced with another ones by merely removing the thermal conduction plate while keeping the cooling plate fixed to the printed board.

According to the cooling system of a printed board of the sixth aspect of the invention, since the thermal conductivity compound is filled between each thermal conduction member, printed board and cooling member, a thermal resistance can be kept at a low value, thereby efficiently cooling the electronic devices. Further, a thermal conductivity is secured even when each thermal conduction member is moved up and down.

According to the cooling system of a printed board of the seventh aspect of the invention, since the notched portion is provided on each thermal conduction member, a part of each electronic device can be seen in a state where each thermal conduction member is fixed. Further, since each thermal conduction member is cylindrical, each thermal conduction member can be turned inside the insertion hole, the necessary portion of the each electronic device can be seen by turning each thermal conduction member. It is also possible to inspect each electronic by inserting a probe or the like in the notched portion.

What is claimed is:

1. A cooling system for a printed board comprising:
   a cooling member, having a cooling path, said cooling member being thermally connected onto a printed board on which a plurality of electronic devices are mounted;
   a plurality of thermal conduction members being thermally connected onto and in correspondence with the plurality of electronic devices;
   said thermal conduction members being inserted into corresponding insertion holes formed in the cooling member so as to be thermally connected thereto, thereby cooling the printed board and electronic devices; and
   a spring member provided on the cooling member for pressing and biasing the thermal conduction members against the electronic devices.

2. The cooling system according to claim 1, further comprising a thermal conductivity elastic member fixing the cooling member onto the printed board.

3. The cooling system according to claim 1, wherein the cooling member comprises:
   a frame-shaped cooling plate fixed to the printed board and having the cooling path; and
   a thermal conduction plate fixed to the cooling plate and having the insertion holes.

4. The cooling system according to claim 3, wherein a cooling pipe forming the cooling path is connected to the cooling plate, and each said thermal conduction member is interposed between the thermal conduction plate and the printed board.

5. The cooling system according to claim 1, wherein each said thermal conduction member is cylindrical and has an electric insulation layer on a lower surface comprising a fluorocarbon resin coating or comprising a polyimide tape.

6. The cooling system according to claim 1, wherein a thermal conductivity compound is filled between each thermal conduction member, each electronic device and the cooling member.

7. The cooling system according to claim 5, wherein each thermal conduction member has a notched portion formed by cutting a part of the cylinder.

8. A cooling system for a printed circuit board comprising:
   a cooling plate secured to the printed circuit board on which a plurality of electronic devices are mounted, said cooling plate having a cooling path, said cooling plate including a plurality of openings therein, each opening being located adjacent a group of said electronic devices;
   thermal conduction plates having insertion holes, said thermal conduction plates being secured to the openings of said cooling plate; and
   a plurality of thermal conduction members inserted into the insertion holes and contacting respective ones of the plurality of electronic devices, said thermal conduction members being thermally connected to the respective thermal conduction plate.

9. The cooling system according to claim 8, wherein a single spring element secured to one of the thermal conduction plates biases said thermal conduction members into contact with the respective electronic devices.

10. The cooling system according to claim 8, wherein each said thermal conduction plate covers only a portion of one of the openings of said cooling plate.

11. The cooling system according to claim 8, wherein said cooling plate includes a cooling pipe having refrigerant circulating therein along a cooling path, wherein heat from said electronic devices travels through said conduction members to said thermal conduction plate, and through said thermal conduction plate to said cooling plate, the heat being carried away from said cooling plate by the circulating refrigerant.

12. A cooling system for a printed circuit board comprising:
   a cooling plate secured to the printed circuit board on which a plurality of electronic devices are mounted, said cooling plate including a cooling pipe having refrigerant circulating therein along a cooling path;
   a thermal conduction plate secured to the cooling plate and having insertion holes; and
   a plurality of thermal conduction members inserted into the insertion holes so as to be thermally connected to said thermal conduction plate, said thermal conduction members contacting corresponding ones of the plurality of electronic devices,
   wherein heat from said electronic devices travels through said thermal conduction members to said thermal conduction plate, and through said thermal conduction plate to said cooling plate, the heat being carried away from said cooling plate by the circulating refrigerant.

13. The cooling system according to claim 12 wherein said cooling plate includes a plurality of openings therein, each opening being located adjacent a group of said electronic devices.

14. The cooling system according to claim 13, wherein said thermal conduction plate is one of a plurality of thermal conduction plates mounted to cover at least portions of the openings of said cooling plate.

15. The cooling system according to claim 14, wherein each said thermal conduction plate includes a single spring element secured thereto, which biases said thermal conduction members into contact with the respective electronic devices.

16. The cooling system according to claim 12, wherein each said thermal conduction plate includes a single spring element secured thereto, which biases said thermal conduction members into contact with the respective electronic devices.

* * * * *